United States Patent
Jacob

(10) Patent No.: US 9,269,628 B1
(45) Date of Patent: Feb. 23, 2016

(54) METHODS OF REMOVING PORTIONS OF AT LEAST ONE FIN STRUCTURE SO AS TO FORM ISOLATION REGIONS WHEN FORMING FINFET SEMICONDUCTOR DEVICES

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/560,557

(22) Filed: Dec. 4, 2014

(51) Int. Cl.
*H01L 21/8234* (2006.01)
*H01L 21/306* (2006.01)
*H01L 21/3105* (2006.01)
*H01L 21/308* (2006.01)
*H01L 21/762* (2006.01)
*H01L 21/02* (2006.01)
*H01L 21/00* (2006.01)

(52) U.S. Cl.
CPC .. *H01L 21/823431* (2013.01); *H01L 21/02381* (2013.01); *H01L 21/02529* (2013.01); *H01L 21/02532* (2013.01); *H01L 21/02538* (2013.01); *H01L 21/308* (2013.01); *H01L 21/30604* (2013.01); *H01L 21/31055* (2013.01); *H01L 21/76224* (2013.01); *H01L 21/823481* (2013.01)

(58) Field of Classification Search
None
See application file for complete search history.

(56) References Cited

U.S. PATENT DOCUMENTS

| | | | |
|---|---|---|---|
| 7,247,887 B2 | 7/2007 | King et al. | |
| 7,588,985 B2 | 9/2009 | Kim | |
| 7,655,534 B2 | 2/2010 | Sheen et al. | |
| 8,580,642 B1 | 11/2013 | Maszara et al. | |
| 9,034,723 B1* | 5/2015 | Shieh | H01L 21/3086 438/424 |
| 9,054,192 B1* | 6/2015 | Chan | H01L 27/1211 |
| 2008/0293203 A1 | 11/2008 | Yoon et al. | |
| 2009/0057846 A1* | 3/2009 | Doyle | H01L 27/0886 257/623 |
| 2011/0101421 A1 | 5/2011 | Xu | |
| 2011/0210404 A1 | 9/2011 | Su et al. | |
| 2012/0315732 A1 | 12/2012 | Kang et al. | |
| 2013/0207122 A1* | 8/2013 | Lin | H01L 27/10879 257/77 |
| 2014/0327045 A1* | 11/2014 | Leobandung | H01L 29/66795 257/192 |
| 2014/0339643 A1* | 11/2014 | Cheng | H01L 21/76224 257/369 |
| 2014/0370699 A1* | 12/2014 | Kim | H01L 21/28008 438/587 |
| 2015/0028454 A1* | 1/2015 | Cheng | H01L 29/785 257/616 |
| 2015/0255609 A1* | 9/2015 | Zhu | H01L 29/6681 257/401 |
| 2015/0263045 A1* | 9/2015 | Leobandung | H01L 29/4966 257/351 |
| 2015/0263088 A1* | 9/2015 | Cheng | H01L 29/0673 257/20 |
| 2015/0270263 A1* | 9/2015 | Zhu | H01L 21/02274 257/386 |

* cited by examiner

*Primary Examiner* — Evren Seven
(74) *Attorney, Agent, or Firm* — Amerson Law Firm, PLLC

(57) ABSTRACT

One illustrative method disclosed herein includes, among other things, forming a plurality of first and second fins that are made of different semiconductor materials that may be selectively etched relative to one another, forming a first insulating material between the plurality of first and second fins, forming an etch mask above the first and second fins that exposes a portion of at least one first fin and exposes a portion of at least one second fin, performing an etching process to remove the exposed portion of the at least one first fin selectively to the first insulating material and the exposed portion of the at least one second fin so as to thereby define at least one removed fin cavity in the first insulating material, removing the patterned etch mask, and forming a second insulating material in the at least one removed fin cavity.

27 Claims, 20 Drawing Sheets

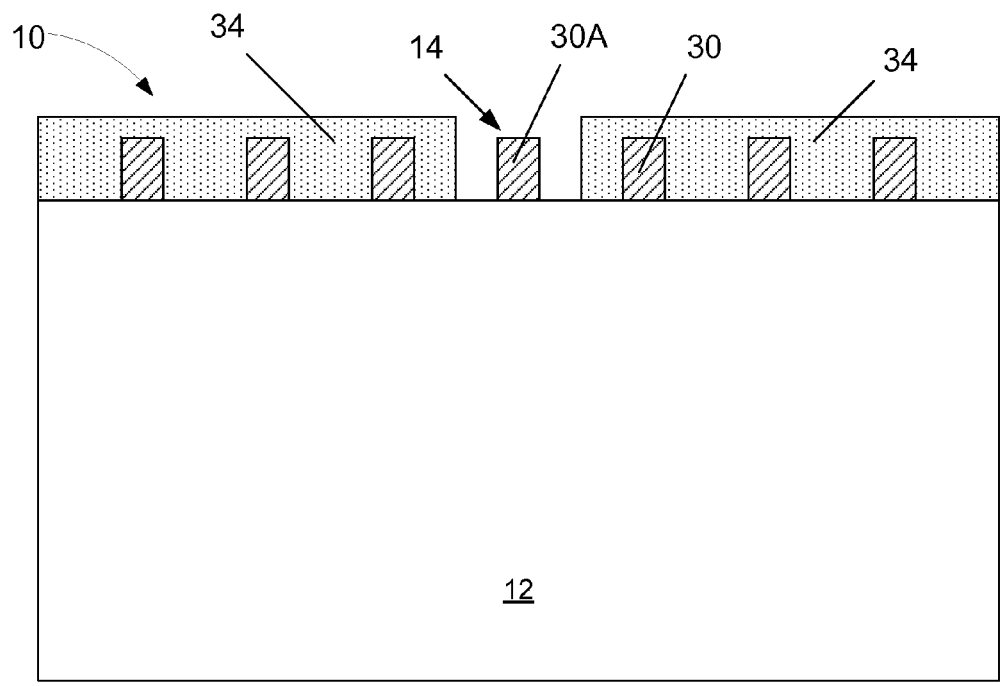
(Prior Art) Figure 1C
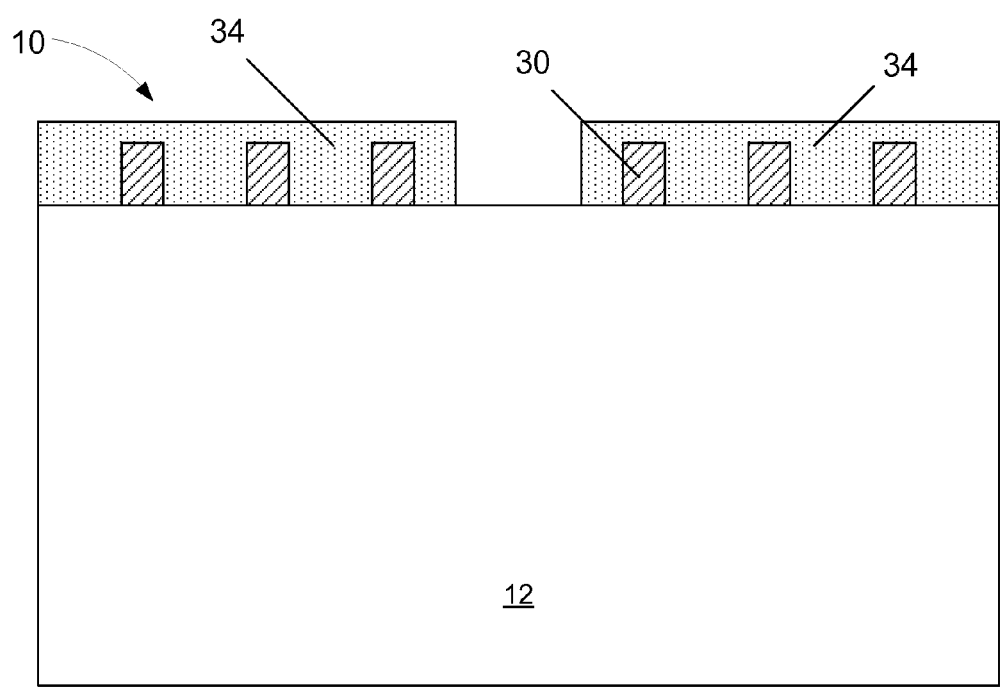
(Prior Art) Figure 1D

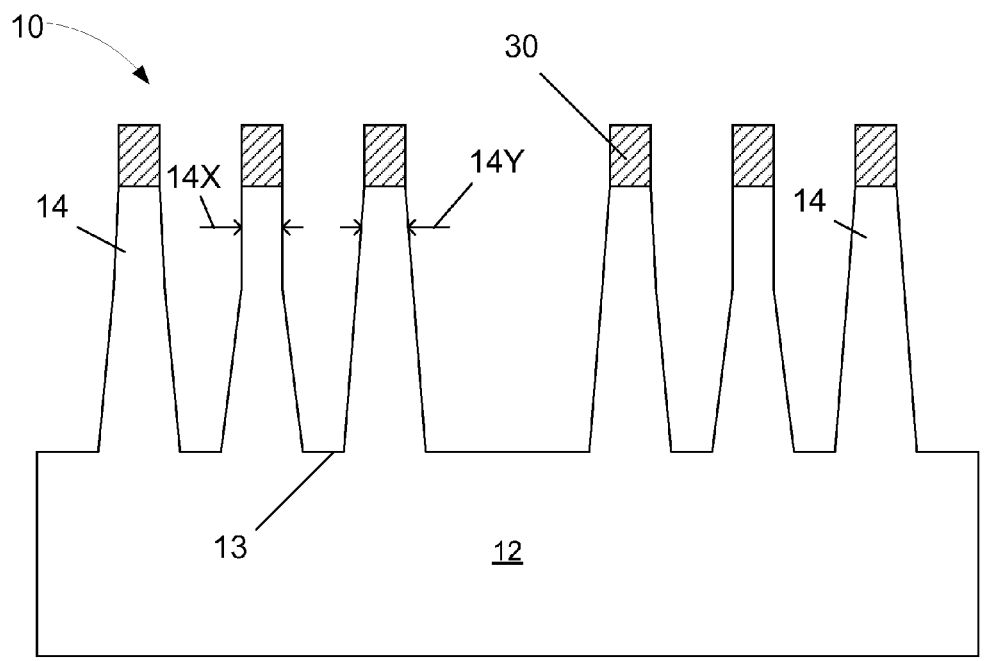
(Prior Art) Figure 1E
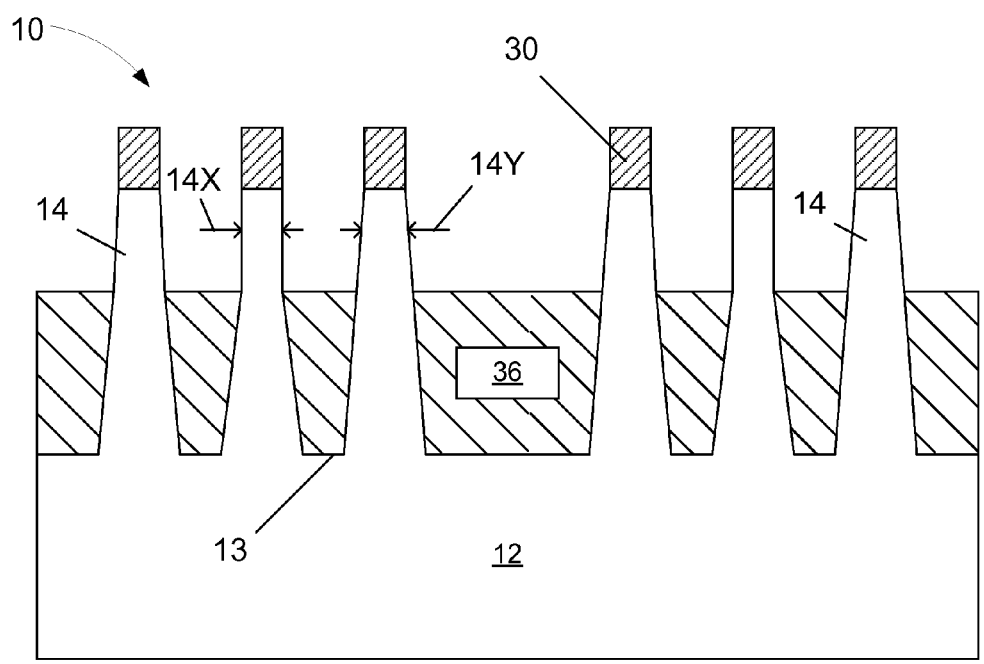
(Prior Art) Figure 1F

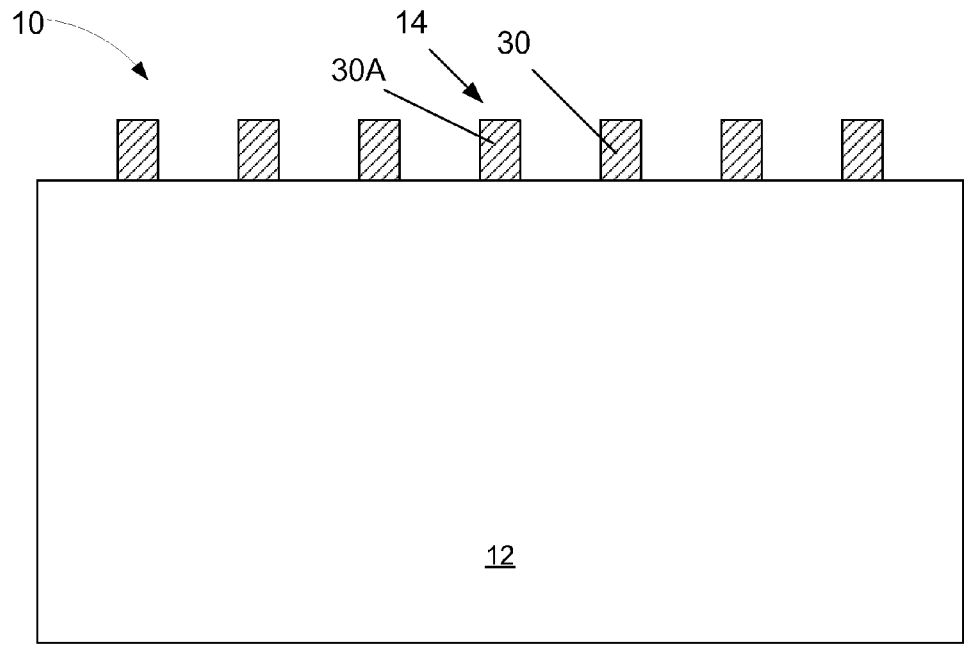
(Prior Art) Figure 1G
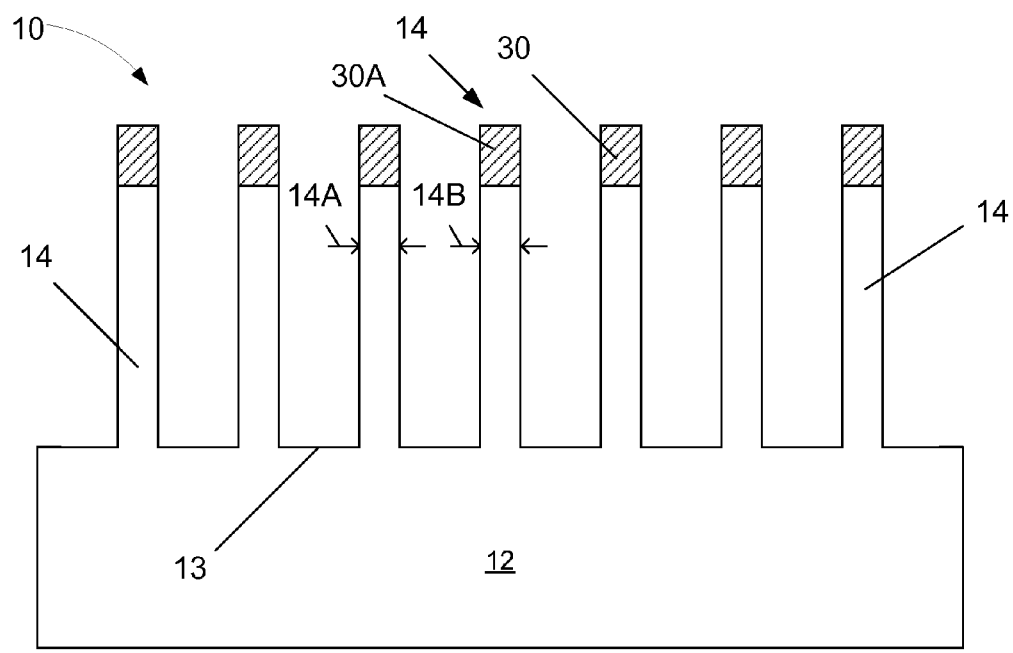
(Prior Art) Figure 1H

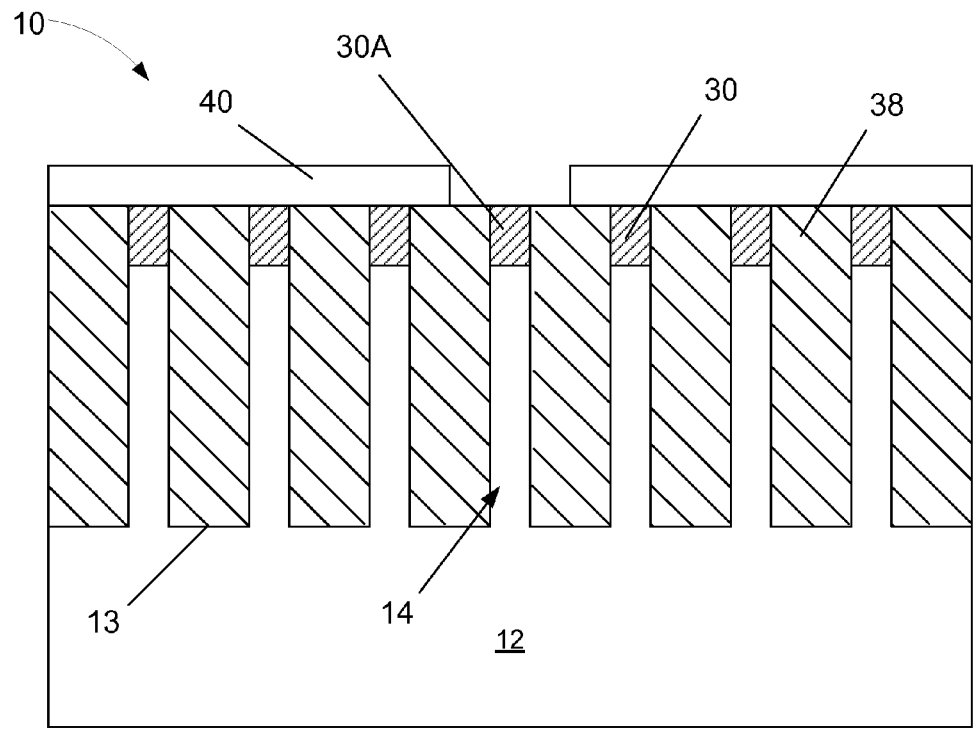
(Prior Art) Figure 1I
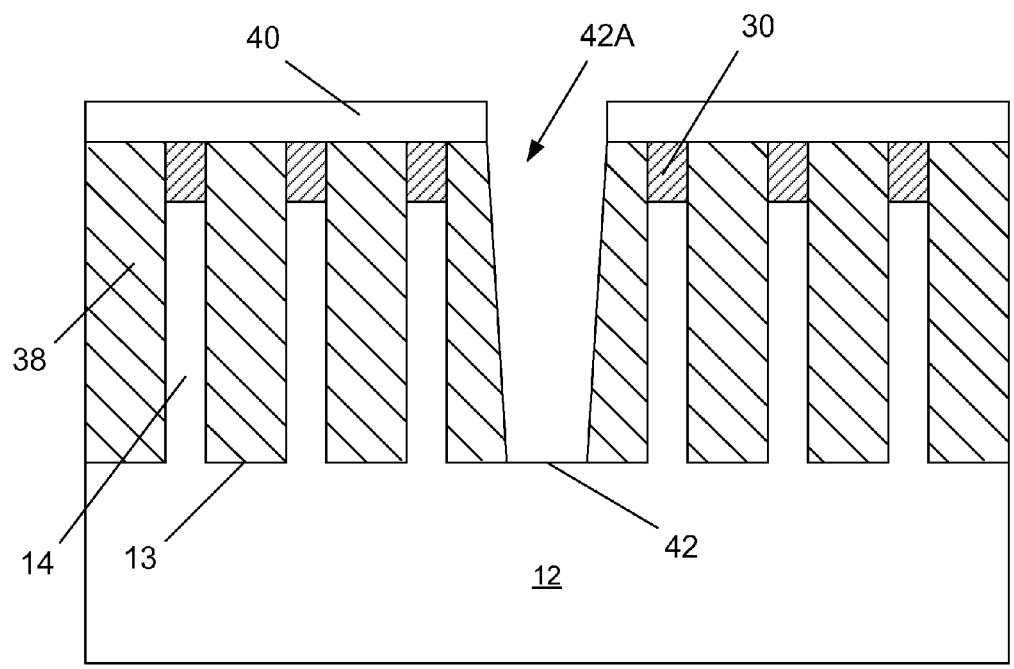
(Prior Art) Figure 1J

METHODS OF REMOVING PORTIONS OF AT LEAST ONE FIN STRUCTURE SO AS TO FORM ISOLATION REGIONS WHEN FORMING FINFET SEMICONDUCTOR DEVICES

BACKGROUND OF THE INVENTION

1. Field of the Invention

Generally, the present disclosure relates to the manufacturing of semiconductor devices, and, more specifically, to various methods of removing portions of at least one fin structure so as to from isolation regions when forming FinFET semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, sidewall spacers 18 and a gate cap layer 20. The fins 14 are formed by etching a plurality of trenches 13 into the substrate 12. A recessed layer of insulating material (not shown) is normally positioned in the trenches 13 between the fins 14. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode (not separately shown) for the device 10. The fins 14 have a three-dimensional configuration: a height 14H, a width 14W and an axial length 14L. The axial length 14L corresponds to the direction of current travel, i.e., the gate length (GL) of the device 10 when it is operational. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to form additional semiconductor material on the portions of the fins 14 in the source/drain region.

Both planar transistor devices and FinFET transistor devices have an isolation structure, e.g., a shallow trench isolation structure, that is formed in the semiconducting substrate around the device so as to electrically isolate the transistor device. Traditionally, isolation structures were always the first structure that was formed when manufacturing semiconductor devices. The isolation structures were formed by etching the trenches for the isolation structures into the substrate and thereafter filling the trenches with the desired insulating material, e.g., silicon dioxide. After the isolation structures were formed, various process operations were performed to manufacture the transistor devices. In the case of a FinFET device, this involved masking the previously formed isolation structure and etching additional trenches into the substrate to thereby define the fins. As FinFET devices have been scaled (i.e., reduced in physical size) to meet ever increasing performance and size requirements, the width 14W of the fins 14 has become very small, e.g., 6-12 nm, and the fin pitch has also been significantly decreased, e.g., the fin pitch may be on the order of about 30-60 nm. As the dimensions of the fins 14 became smaller, problems arose with manufacturing the isolation structures before the fins 14 were formed. As one example, trying to accurately define very small fins in regions that were separated by relatively large isolation regions was difficult due to the non-uniform spacing between various structures on the substrate.

Various techniques have been employed to try to overcome the above-mentioned problems. One manufacturing technique involves initially forming trenches 13 in the substrate 12 to define multiple "fins" that extend across the substrate 12, and thereafter removing some of the fins 14 (or portions thereof) where larger isolation structures will be formed. Using this type of manufacturing approach, better accuracy and repeatability may be achieved in forming the fins 14 to very small dimensions due to the more uniform etching environment in which the etching process that forms the trenches 13 is performed.

As indicated above, after the trenches 13 are formed, some portion of the fins 14 must be removed to create room for or define the spaces where isolation regions will ultimately be formed. There are two commonly employed techniques for accomplishing the goal of removing the desired number and portions of the fins 14. One such removal process is typically referred to as "Fins-cut-First," as will be described with reference to FIGS. 1B-1E. FIG. 1B depicts the device 10 after a patterned hard mask layer 30, e.g., comprised of a patterned layer of silicon nitride (pad-nitride) and a patterned layer of silicon dioxide (pad-oxide), was formed above the substrate 12 in accordance with the desired fin pattern and pitch. In the depicted example, only a single fin will be removed, i.e., the fin 14 corresponding to the feature 30A, to make room for the isolation region. However, as will be recognized by those skilled in the art, depending upon the desired final size of the isolation region, more than one fin may be removed. Of course, the entire axial length 14L of the fin 14 need not be removed, but it may be in some applications.

FIG. 1C depicts the device 10 after a patterned masking layer 34, e.g., a patterned layer of photoresist, was formed above the patterned hard mask layer 30. The patterned masking layer 34 has an opening that exposes the feature 30A for removal.

FIG. 1D depicts the device 10 after an etching process was performed through the patterned masking layer 34 so as to remove the exposed feature 30A of the patterned hard mask layer 30.

FIG. 1E depicts the device 10 after the patterned masking layer 34 was removed and after an etching process was performed through the patterned hard mask layer 30 (without the feature 30A) so as to define full-depth trenches 13 in the substrate 12 that define the fins 14. Due to the removal of the feature 30A, this etching process removes the portions of the substrate 12 that would have otherwise formed a fin 14 in the area under the feature 30A. One problem with the "fins-cutfirst" approach is that it inevitably causes different fin sizes, i.e., the dimensions 14X and 14Y are different. This is especially true between fins 14 inside an array of fins and the fins at the edge of the active region that is close to the isolation region. These dimensional variations occur due to etch loading effects wherein there are different etch rates and etch profiles due to differing patterning densities, pitch, etc.

FIG. 1F depicts the device 10 after several process operations were performed. First, a layer of insulating material 36, such as silicon dioxide, was formed so as to overfill the trenches 13. A chemical mechanical polishing (CMP) process was then performed to planarize the upper surface of the insulating material 36 with the top of the patterned hard mask 30. Thereafter, an etch-back process was performed to recess the layer of insulating material 36 between the fins 14 and thereby expose the upper portions of the fins 14, which corresponds to the final fin height of the fins 14. At this point in the process, the patterned hard mask 30 may or may not be thereafter removed. Next, the gate structure (not shown) of the device 10 may be formed using either gate-first or gate-last manufacturing techniques.

Another fin removal process is typically referred to as "Fins-cut-Last," as will be described with reference to FIGS. 1G-1J. FIG. 1G depicts the device 10 after the patterned hard mask layer 30 was formed above the substrate 12 in accordance with the desired fin pattern and pitch. As before, in the depicted example, only a single fin will be removed, i.e., the fin 14 corresponding to the feature 30A, to make room for the isolation region. However, as will be recognized by those skilled in the art, depending upon the desired final size of the isolation region, more than one fin may be removed.

FIG. 1H depicts the device 10 after an etching process was performed through the patterned hard mask layer 30 so as to define full-depth trenches 13 in the substrate 12 that define the fins 14. Note that, in the Fins-cut-Last approach, the size of the fins tends to be more uniform, i.e., the dimension 14A is approximately equal to the dimension 14B. This is primarily due to the fact that, in this approach, fins 14 are initially formed everywhere on the wafer with a uniform width and fin pitch, and there is no undesirable etch loading effects.

FIG. 1I depicts the device 10 after several process operations were performed. First, a layer of insulating material 38, such as silicon dioxide, was formed so as to overfill the trenches 13. Then a CMP process was performed to planarize the upper surface of the layer of insulating material 38 with the patterned hard mask layer 30. Next, a patterned masking layer 40, e.g., a patterned layer of photoresist, was formed above the layer of insulating material 38. The patterned hard mask layer 40 has an opening that is positioned above the underlying fin 14 (or portion thereof) that is to be removed.

FIG. 1J depicts the device 10 after one or more etching processes were performed to remove the exposed portions of the layer of insulating material 38, the exposed portions of the hard mask layer 30, i.e., the feature 30A, and the underlying fin 14 by forming a trench 42 in the substrate 12. Inevitably, there will be some tapering of the sidewalls of the trench 42. Although not depicted in the drawings, after the trench 42 is formed, the patterned masking layer 40 will be removed and additional oxide material (not shown) will be formed through the opening 42A in the trench 42 where the fin 14 was removed. Then a chemical mechanical polishing (CMP) process will be performed to planarize the upper surface of all of the insulating materials with the top of the patterned hard mask 30. Thereafter, the isolation regions between devices will be masked and an etch-back process will be performed to recess the layer of insulating material 38 between the fins 14 for each device and thereby expose the upper portions of the fins 14, which corresponds to the final fin height of the fins 14.

FIGS. 1K-1L are simplistic plan views depicting the basic Fins-Cut-Last process flow. As shown therein, a plurality of fins 14 were formed above the substrate, and a patterned etch mask 50, a so-called "cut-mask" was formed above the fins. FIG. 1L depicts the product after the exposed portions of the fins 14 were removed, after the etch mask 50 was removed, and after a recessed layer of insulating material 52 was formed between the cut fins 14.

One problem with the fins-cut-last approach is that if the size (CD) of the opening 42A of the trench 42 is relatively large, then there is less margin for misalignment error when removing the unwanted fin, i.e., there is less margin for error so as to avoid damage to fins adjacent the fin that is removed when the trench 42 is etched. Additionally, although not depicted, if the size of the opening 42A is kept small, there will typically be some residual portion of the fin 14 remaining at the bottom of the trench 42. Conversely, if the size of the opening 42A is increased in an effort to insure complete removal of the unwanted fin at the bottom of the trench 42, then there is a much greater likelihood of damaging the fins adjacent the trench 42 when the trench 42 is etched into the substrate 12. These issues only get worse as the depth of the trench 42 increases and the lateral spacing between adjacent fins 14 gets smaller as is required for advanced devices. The chances for lateral misalignment of the opening 42A in the patterned etch mask 40 is also greater when forming more densely packed fins, which leads to increased chances of damaging fins that are adjacent to the sidewalls of the trench 42.

In many applications, it would be desirable to only remove a portion of a single fin so as to form a very narrow isolation region between two active devices. However, as fin pitches have decreased, it is very difficult to remove only a single fin. In some cases, manufacturers have instead removed portions of two adjacent fins rather than deal with the problems associated with trying to remove only a single fin. This results in a wider isolation region which, in turn, consumes additional valuable plot space on the substrate.

The present disclosure is directed to various methods that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of removing portions of at least one fin structure so as to form isolation regions when forming FinFET semiconductor devices. One illustrative method disclosed herein includes, among other things, forming a plurality of first and second fins above a semiconductor substrate, wherein the first fins are made of a first semiconductor material and the second fins are made of a second semiconductor material, wherein the first and second semiconductor materials are different from one another and may be selectively etched relative to one another, forming a first insulating material above the substrate and between the plurality of first and second fins, forming a patterned etch mask above the plurality of first and second fins, the patterned etch mask having an opening that exposes a portion of at least one first fin and exposes a portion of at least one second fin, performing an etching process through the opening in the patterned etch mask to remove the exposed portion of the at least one first fin selectively to the first insulating material and the exposed portion of at least one second fin so as to thereby define at least one removed fin cavity in the first insulating material, removing the patterned etch mask and forming a second insulating material in the at least one removed fin cavity.

In another example, a method disclosed herein involves, among other things, forming a plurality of first and second fins above a semiconductor substrate, wherein the first fins are made of a first semiconductor material and the second fins are made of a second semiconductor material, wherein the first and second semiconductor materials are different from one another and may be selectively etched relative to one another, forming a first insulating material above the substrate and between the plurality of first and second fins, forming a patterned etch mask above the plurality of first and second fins, the patterned etch mask having an opening that exposes a portion of only a single first fin and exposes a portion of at least one second fin, performing an etching process through the opening in the patterned etch mask to remove the exposed portion of the single first fin selectively to the first insulating material and the exposed portion of at least one second fin so as to thereby define a removed fin cavity in the first insulating material, removing the patterned etch mask and forming a second insulating material in the removed fin cavity.

BRIEF DESCRIPTION OF THE DRAWINGS

The disclosure may be understood by reference to the following description taken in conjunction with the accompanying drawings, in which like reference numerals identify like elements, and in which:

FIGS. 1B-1L depict illustrative prior art methods of removing selected fin structures when forming FinFET semiconductor devices.

Figure 1A:
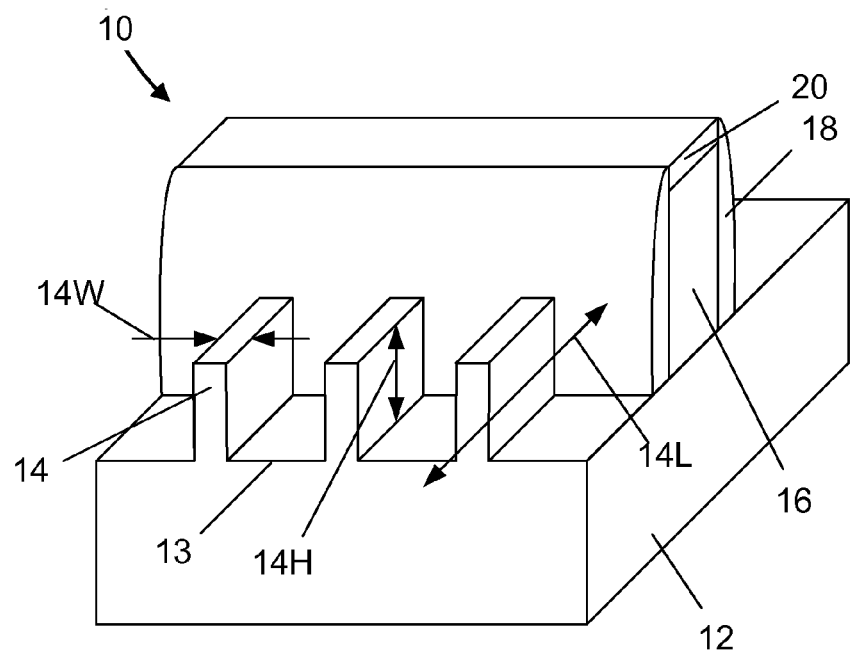
FIG. 1A is a perspective view of one illustrative embodiment of a prior art FinFET device.
Figure 1B:
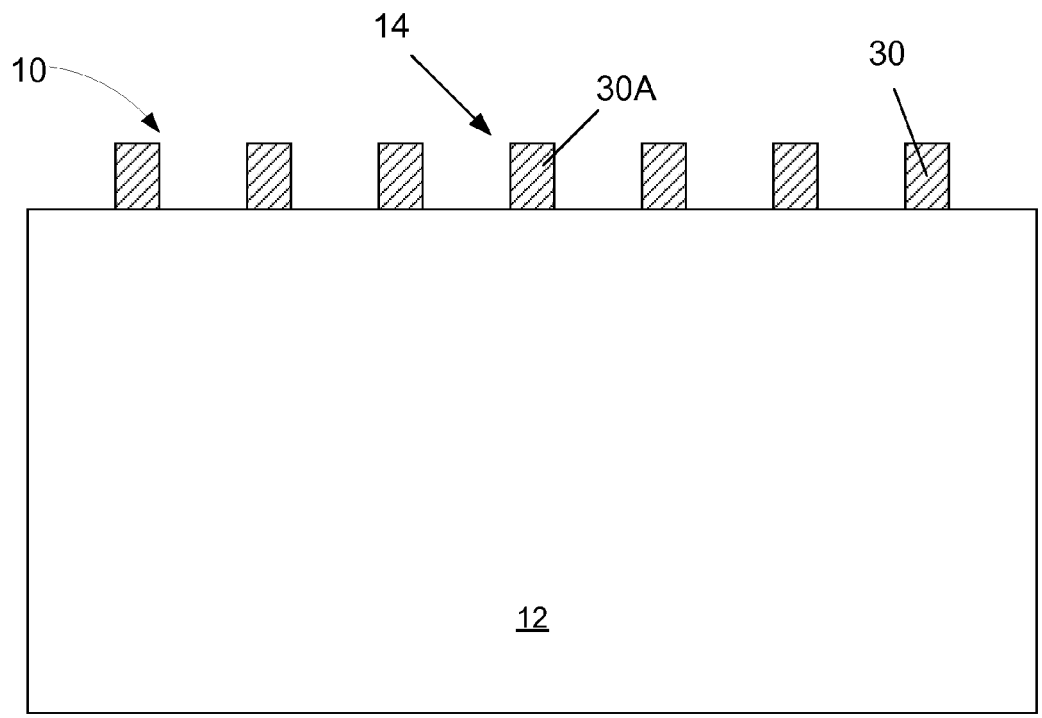
Figure 1K:
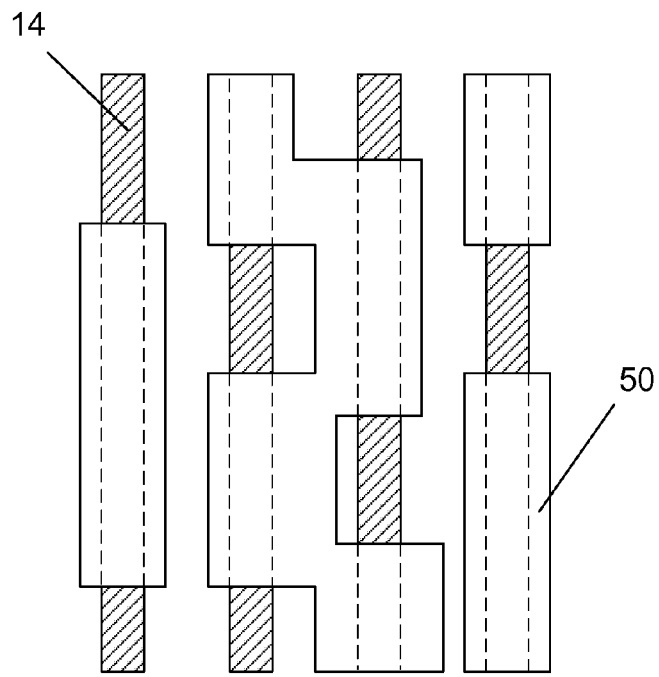
Figure 1L:
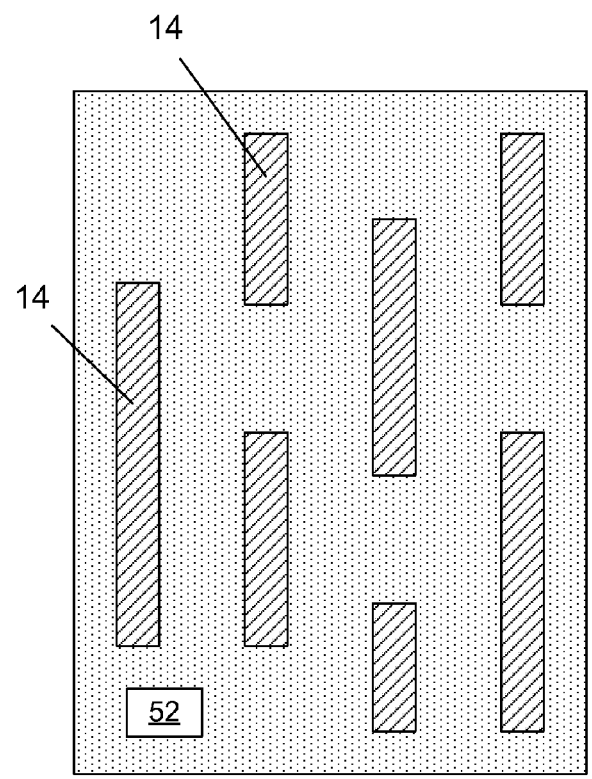

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins for FinFET semiconductor devices and the selective removal of some of the fins. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2-27 depict various illustrative methods disclosed herein for removing a portion of a representative single fin structure so as to form isolation regions when forming FinFET semiconductor devices. Of course, as will be recognized by those skilled in the art after a complete reading of the present application, the methods disclosed herein may be employed to remove multiple fin structures. The integrated circuit products 100 depicted herein are formed in and on a semiconducting substrate 102, such as a bulk substrate or an active layer of an SOI type substrate. The substrate 102 may be made of silicon or it may be made of materials other than silicon. Thus, the terms "substrate" or "semiconducting substrate" should be understood to cover all forms of all semiconductor materials. As will be recognized by those skilled in the art after a complete reading of the present application, the illustrative integrated circuit product 100 may be comprised of a plurality of N-type FinFET devices and/or a plurality of P-type FinFET devices.

As will be appreciated by those skilled in the art after a complete reading of the present application, various doped regions, e.g., source/drain regions, halo implant regions, well regions and the like, for the devices are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spincoating techniques, etc. The thicknesses of these various layers of material may also vary depending upon the particular application. With reference to the attached figures, various illustrative embodiments of the methods and devices disclosed herein will now be described in more detail.

Figure 2:
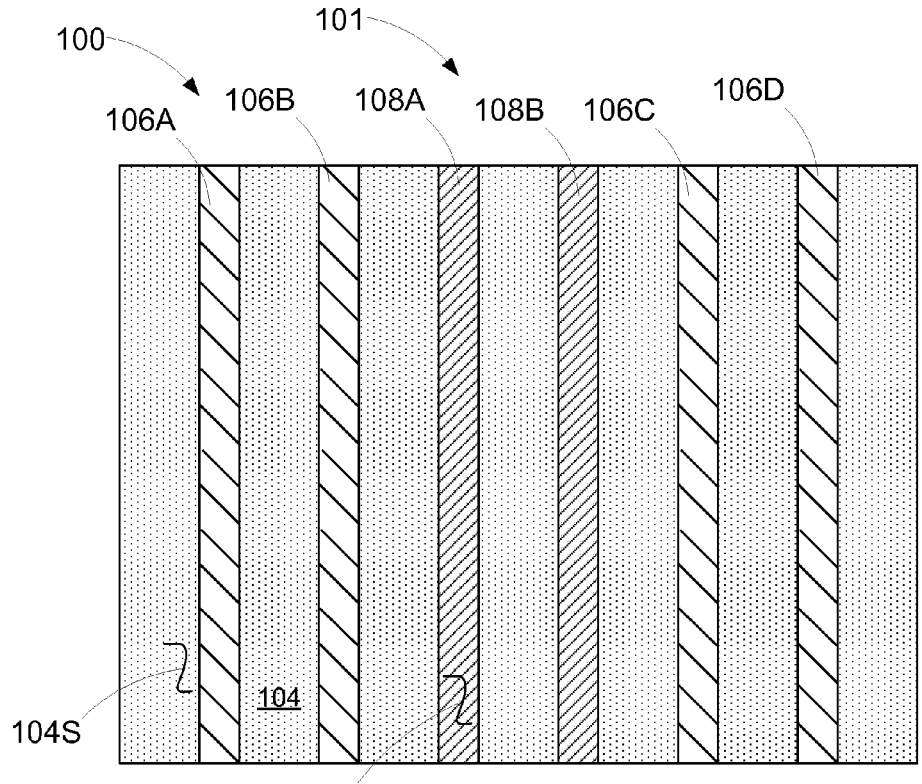
FIGS. 2-27 depict various illustrative methods disclosed herein for removing a portion of at least one fin structure so as to form isolation regions when forming FinFET semiconductor devices.

FIG. 2 depicts a plan view of the product 100 after a plurality of fins generally designated with the reference number 101 have been formed above a substrate 102. Also depicted is a portion of a layer of insulating material 104, e.g., silicon dioxide, that was formed between the fins 101. The upper surface 104S of the layer of insulating material 104 is substantially planar with the upper surface 101S of the fins 101. The fins 101 may have any desired width and be formed on any desired pitch. In the methods disclosed herein, the fins 101 are comprised of a plurality of first fins 106 (A-D) and a plurality of second fins 108 (A-B). The fins 106, 108 are made of semiconductor materials that may be selectively etched relative to one another. For example, the fins 106 may be comprised of silicon, while the second fins 108 are made of silicon-germanium, or vice-versa. As another example, the fins 106 may be made of silicon-germanium, while the second fins 108 are made of silicon-carbon. The substrate 102 may be made of the same material as one of the fins 106 or 108 or it may be made of a material that is different from either of the materials used for the fins 106 and 108, e.g., the substrate 102 may be made of silicon, the first fins 106 may be made of silicon-germanium and the second fins 108 may be made of a III-V semiconductor material. Of course, although only fins 106 and 108 are shown herein, the methods disclosed herein may be extended to situations where additional fin materials are used such that groups of fins are formed of three or four, etc., different materials that may be selectively etched relative to one another. Thus, the presently disclosed inventions should not be considered to be limited to the illustrative examples depicted herein. The fins 101 may be formed in a strained or relaxed condition. In some cases, a strain-relaxation-buffer (SRB) layer (not shown) may be provided between the fins 106 and/or 108 and the underlying substrate 102.

Forming fins 101 with different materials of construction may be formed using a variety of techniques. For example, the techniques described in U.S. Pat. No. 8,580,642, as well as the prior art techniques discussed therein, may be employed to form the fins 106, 108 comprised of different semiconductor materials. U.S. Pat. No. 8,580,642 is hereby incorporated by reference in its entirety. If needed, appropriate masking techniques may be involved in forming the fins 106, 108 comprised of different semiconductor materials in different regions of the substrate 102.

Figure 3:
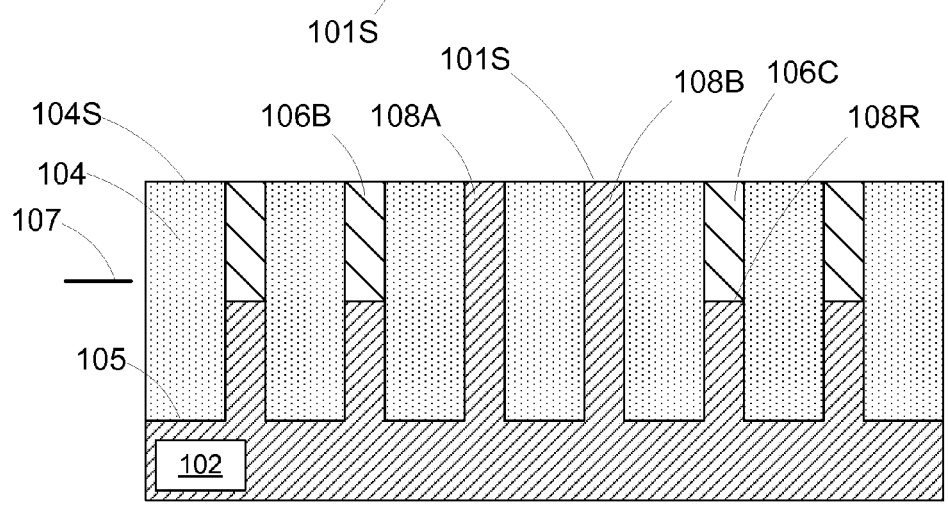

As shown in FIG. 3 (cross-sectional view), in one embodiment, the fins 108 and the substrate 102 are comprised of the same material, e.g., silicon or silicon-germanium, as reflected by the same cross-hatching used for both the fins 108 and the substrate 102. The fins 106 may be formed by recessing portions of the original fins while masking the fins 108, and thereafter forming the fins 106 in the cavities above the recessed upper surface 108R of the fins. The initial silicon fins 108 may be formed across the substrate 102 by performing an etching process through a patterned etch mask (not shown) so as to form a plurality of fin-formation trenches 105 in the substrate 102. The relative thicknesses of the substrate 102 and the height of the fins are not to scale in the attached drawings. The height (i.e., the depth of the trenches 105) and the width of the initial fins 108 may vary depending upon the particular application and the desired pattern of the fins that will ultimately be formed in the substrate 102. Thereafter, the layer of insulating material 104 was formed so as to over-fill the trenches 105 and a CMP process was performed that stops on the upper surface 101S of the original fins 108 so as to remove the patterned hard mask. At that point, the fins 108A-B may be masked and the other fins may be recessed to make room for the fins 106. Eventually, at some point in the process, a recess etching process will be performed on the layer of insulating material 104 such that, after recessing, the upper surface of the layer of insulating material 104 will be positioned at a desired height level 107 within the trenches 105 and thereby expose a desired height level of the fins 106 and 108, which corresponds to the final fin height of the fins 106, 108.

Figure 4:
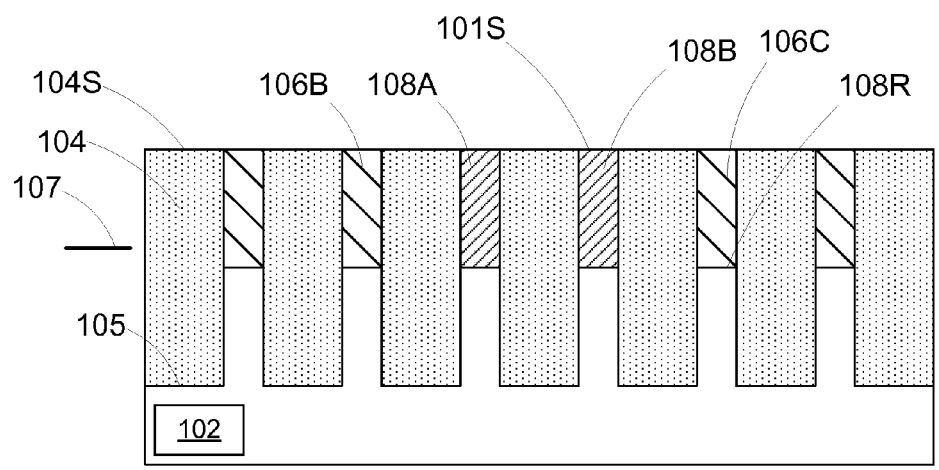

FIG. 4 depicts an example wherein the fins 106, 108 and the substrate 102 are all made of different materials. For example, the substrate 102 may be made of silicon, the fins 106 may be made of silicon-carbon and the fins 108 may be made of silicon-germanium. An SRB layer (not shown) may also be present between the fins 106, 108 and the substrate 102.

Figure 5:
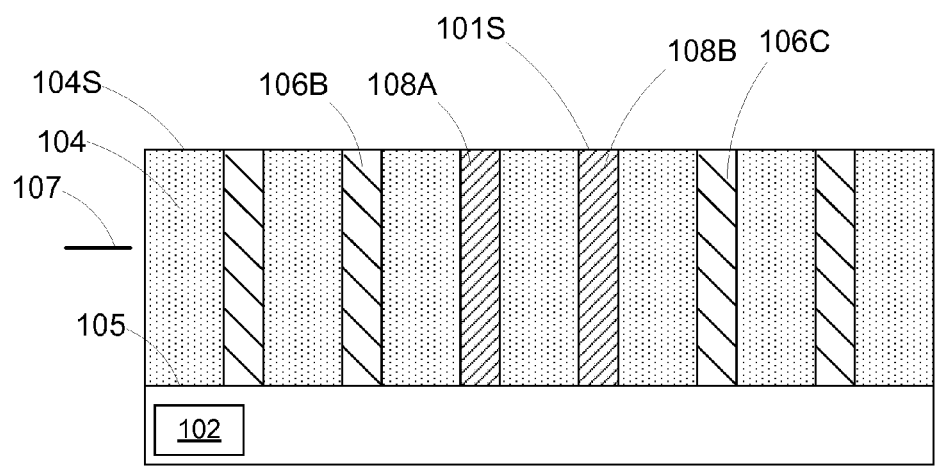

FIG. 5 depicts yet another example wherein the fins 106, 108 and the substrate 102 are all made of different materials. For example, the substrate 102 may be made of silicon, the fins 106 may be made of silicon-germanium and the fins 108 may be made of an III-V semiconductor material. An SRB layer (not shown) may also be present between the fins 106, 108 and the substrate 102. In this example, the fins 106, 108 may be formed by blanket depositing one or more materials above the substrate 102 and thereafter forming the fins 106, 108 by performing traditional patterning and etching processes. FIGS. 2-5 are only illustrative examples of several possible configurations of the fins 106, 108 and the substrate 102, and the presently disclosed inventions should not be considered to be limited to any of these illustrative embodiments.

Figure 6:
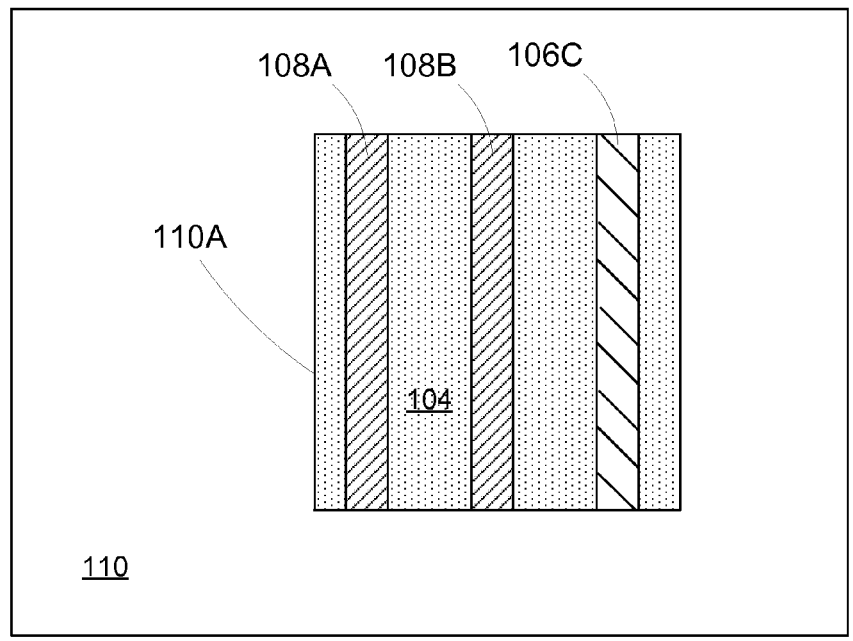
Figure 7:
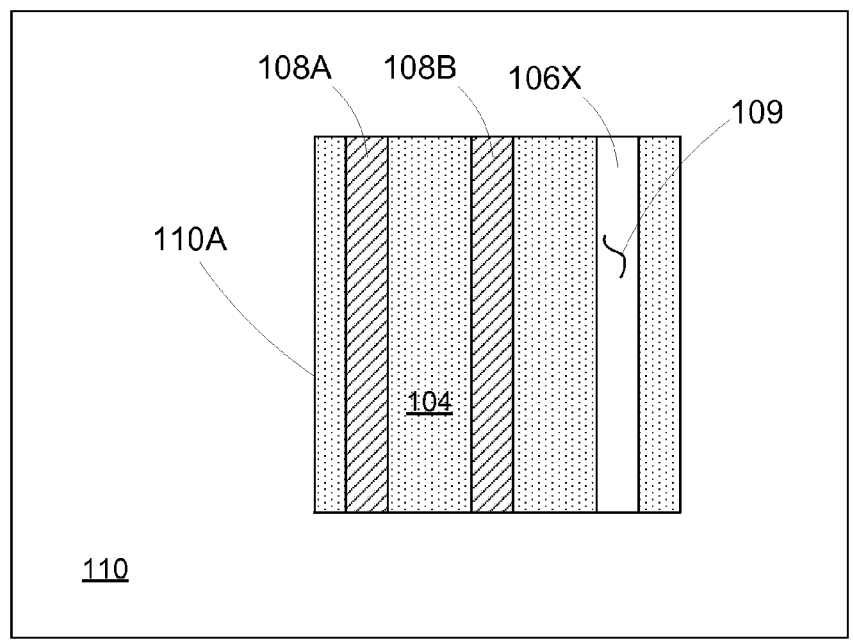

After formation of the fins 106, 108, a portion of at least one fin will be removed so that isolation material may be formed in its place. Accordingly, FIG. 6 depicts the product 100 after a patterned etch mask 110, (e.g., a fin-cut-mask) is formed above the fins 106, 108 and the layer of insulating material 104. In one embodiment, the patterned etch mask 110 may be comprised of a patterned layer of photoresist or a patterned hard mask layer. In this example, the patterned etch mask 110 has an opening 110A that exposes both of the fins 108A-B and only one of the first fins—fin 106C. Of course, if desired, using the methods disclosed herein, the opening 110A could be made larger so as to expose more than one of the first fins 106. Since the materials for the fins 106 and 108 may be selectively etched relative to one another, the opening 110A may be larger than it would otherwise be if the opening 110A was sized so as to only expose the single fin 106C. Additionally, given the etch selectivity between the fins 106, 108, there is more tolerance for misalignment of the location of the opening 110A as compared to a patterned etch mask with an opening that was sized so as to only expose the single fin 106C. Stated another way, using the methods disclosed herein, the process window for formation of the cut mask 110 is greater than it is for the formation of the cut masks described in the background section of this application. Moreover, given the etch selectivity between the fins 106, 108, there will be no damage to the fins 108 adjacent the fin 106C when the exposed portion of the fin 106C is removed. Lastly, since the portions of the fins 106, 108 exposed by the opening 110A may be removed selectively to one another, i.e., the single fin 106C may be selectively removed relative to the two fins 108A-B (as depicted in FIG. 7 and described below) or the two fins 108A-B may be selectively removed relative to the single exposed fin 106C (a situation that is not depicted in FIG. 7). Such selective removal of the fins exposed by the opening 110A is true for all embodiments disclosed herein, i.e., the fin(s) 106 may be removed relative to the fin(s) 108 or vice-versa.

FIG. 7 depicts the product 100 after an etching (wet or dry) process was performed through the opening 110A in the patterned masking layer 110 to remove the exposed portion of the representative single fin 106C selectively relative to the second fins 108A-B and the layer of insulating material 104. This process operation results in the formation of a removed fin cavity 106X (or multiple removed fin cavities when more than one of the fins 106 is exposed by the opening 110A). In the example depicted in FIG. 3, this process operation would result in the exposure of the recessed surface 108R (see FIG. 3) of the recessed fin that is positioned under the removed portion of the fin 106C. However, since the substrate 102 need not be made of the same material as either the fins 106 or 108, the exposed surface 109 that underlies any of the removed portions of the fins disclosed herein will not be shaded. In some cases, the surface 109 exposed in the removed fin cavity 106X may be the substrate 102, a portion of a fin structure, an SRB layer or another material layer. In any situation, the fin 106C (or other fins removed herein) may be removed selectively to the surface 109 exposed within the removed fin cavity 106X.

Figure 8:
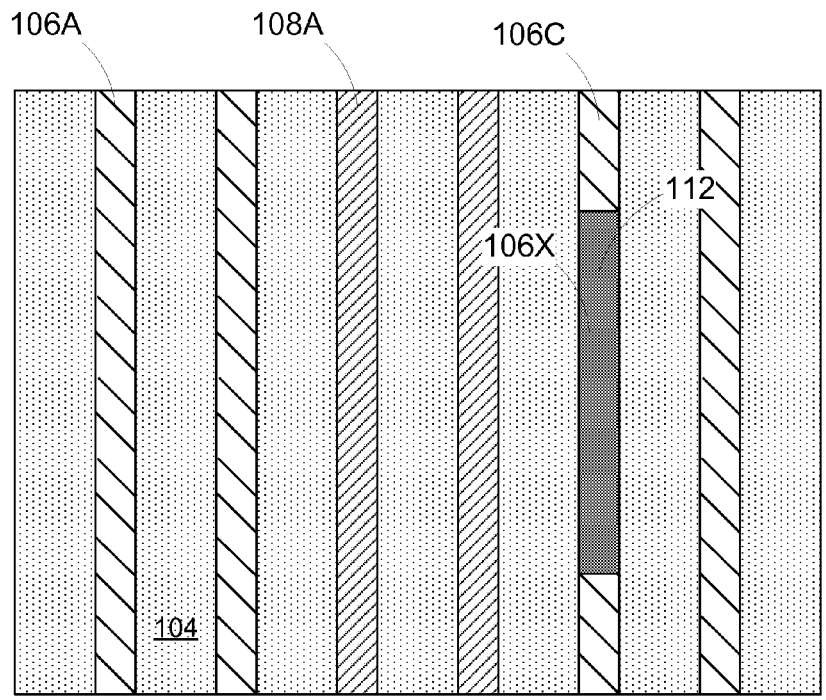

FIG. 8 depicts the product after several process operations were performed. First, the patterned etch mask 110 was removed. Thereafter, an insulating material 112 was deposited so as to over-fill the removed fin cavity 106X. Next, a planarization process, e.g., a CMP process, was performed to planarize the insulating material 112 with the upper surface of the fins 106, 108 and the insulating material 104. In some cases, the insulating material 112 may be comprised of the same material as that of the insulating material 104, although that may not be the case in all applications. The material 112 will become part of an isolation structure that is positioned between adjacent FinFET devices. At this point in the process flow, traditional manufacturing techniques may be performed to complete the fabrication of the FinFET devices for the product 100. For example, the layer of insulating material 104 may be recessed, and gate structures (not shown) for the FinFET devices may be formed using either gate-first or gate-last manufacturing techniques, etc.

Figure 9:
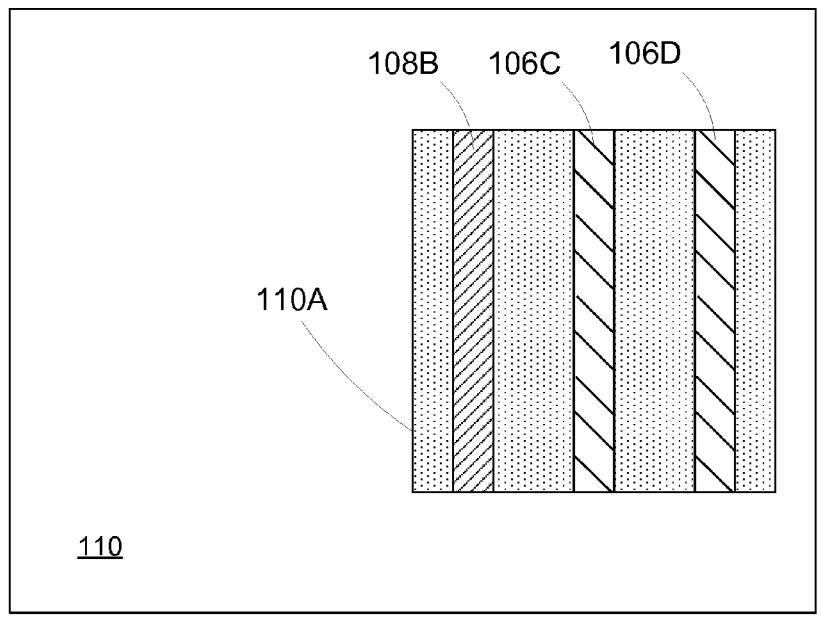
Figure 10:
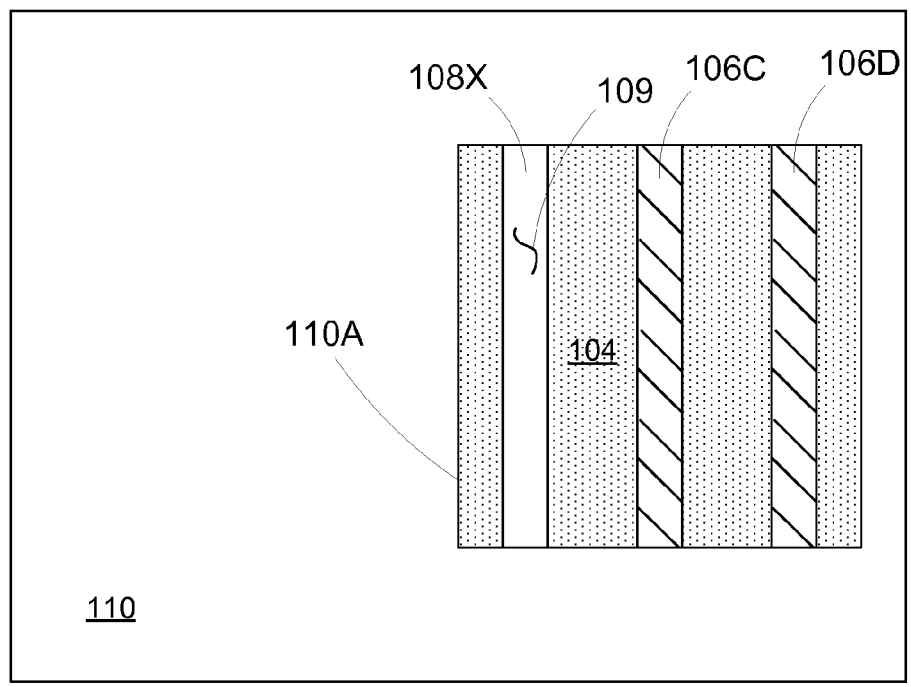
Figure 11:
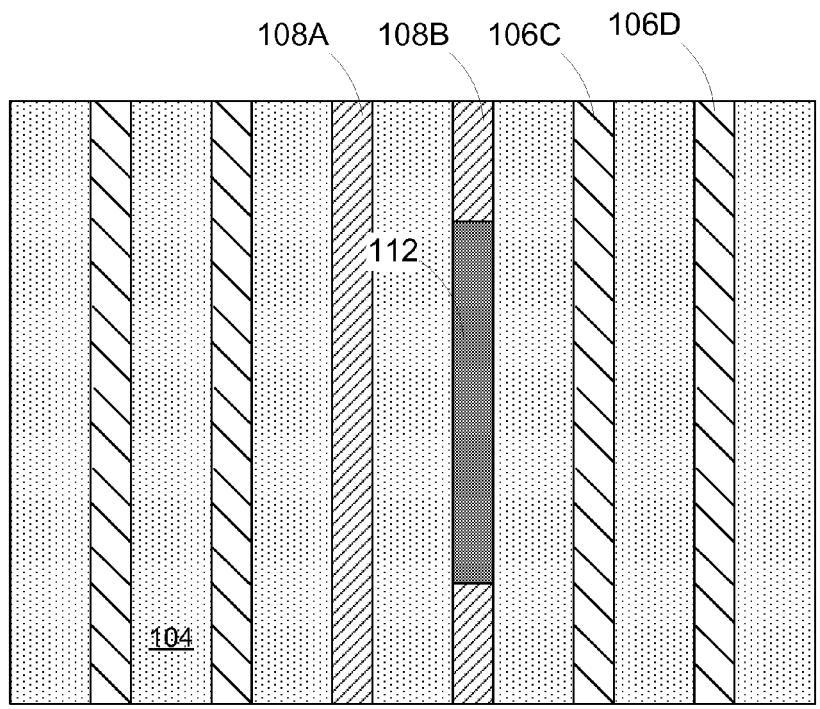

FIG. 9 depicts an example wherein the patterned masking layer 110 is formed such that the opening 110A exposes a representative single second fin—fin 108B—and the fins 106C-D. As before, if desired, the opening 110A could be made larger so as to expose more than one of the second fins 108. FIG. 10 depicts the product after an etching (wet or dry) process was performed through the opening 110A in the patterned masking layer 110 to remove the exposed portion of the single fin 108B selectively relative to the first fins 106C-D, the layer of insulating material 104 and the exposed surface 109 in the bottom of the removed fin cavity 108X. As before, the exposed surface 109 in the removed fin cavity 108X may be the substrate 102, a portion of a fin structure, an SRB layer or another material layer. In any situation, portions of the fin 108B (or other fins removed herein) may be removed selectively relative to the surface 109 exposed within the removed fin cavity 108X. FIG. 11 depicts the product after the patterned etch mask 110 was removed, the insulating material 112 was deposited so as to over-fill the removed fin cavity 108X and after a planarization process, e.g., a CMP process, was performed to planarize the insulating material 112 with the upper surface of the fins and the insulating material 104. At this point in the process flow, traditional manufacturing techniques may be performed to complete the fabrication of the FinFET devices for the product 100.

Figure 12:
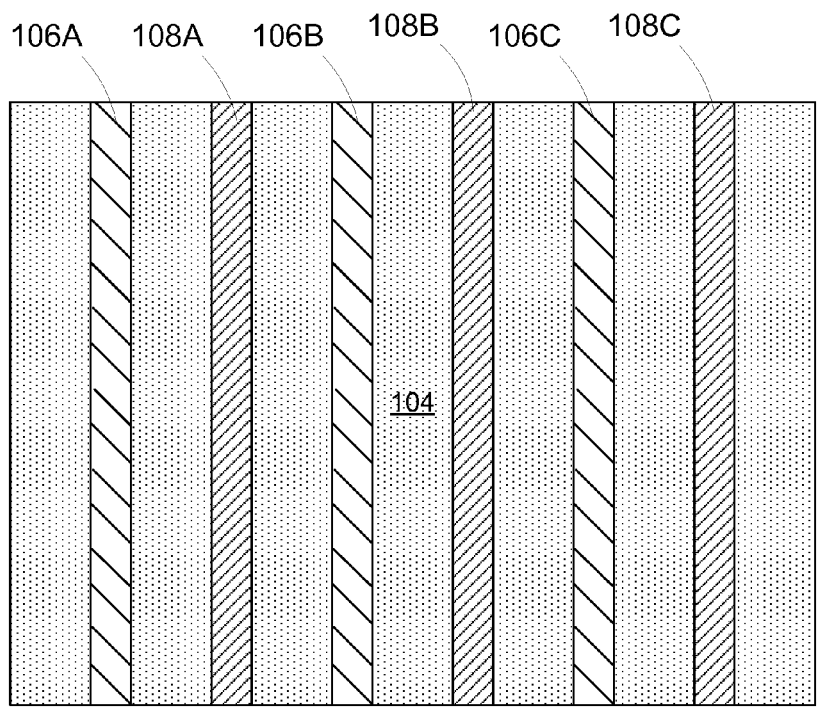
Figure 13:
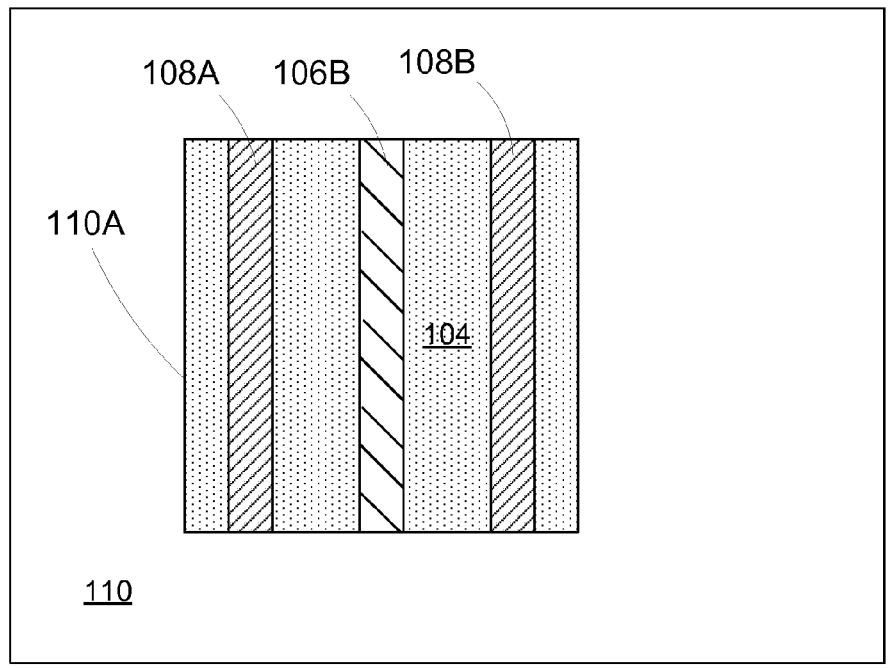
Figure 14:
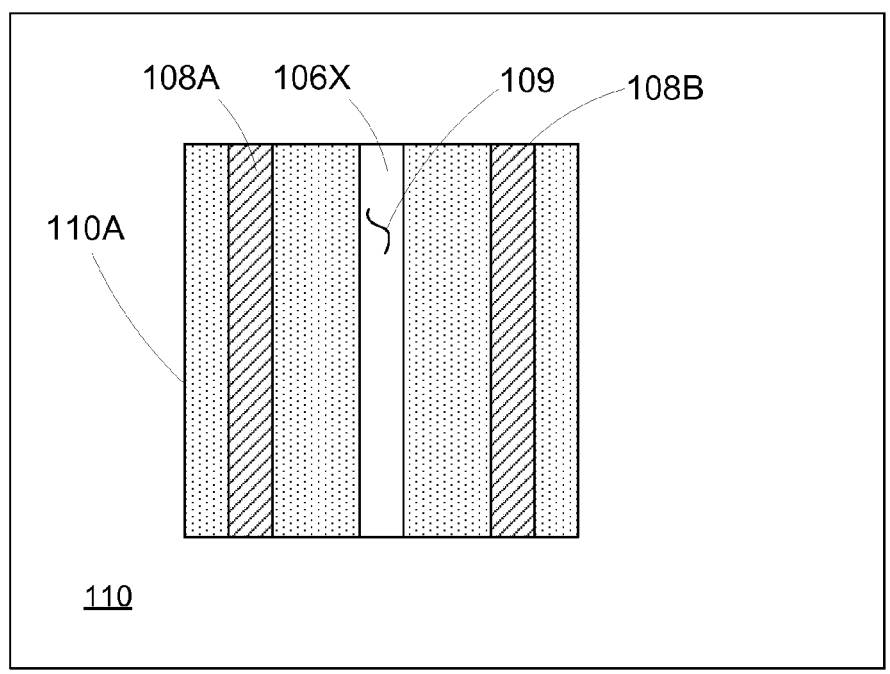
Figure 15:
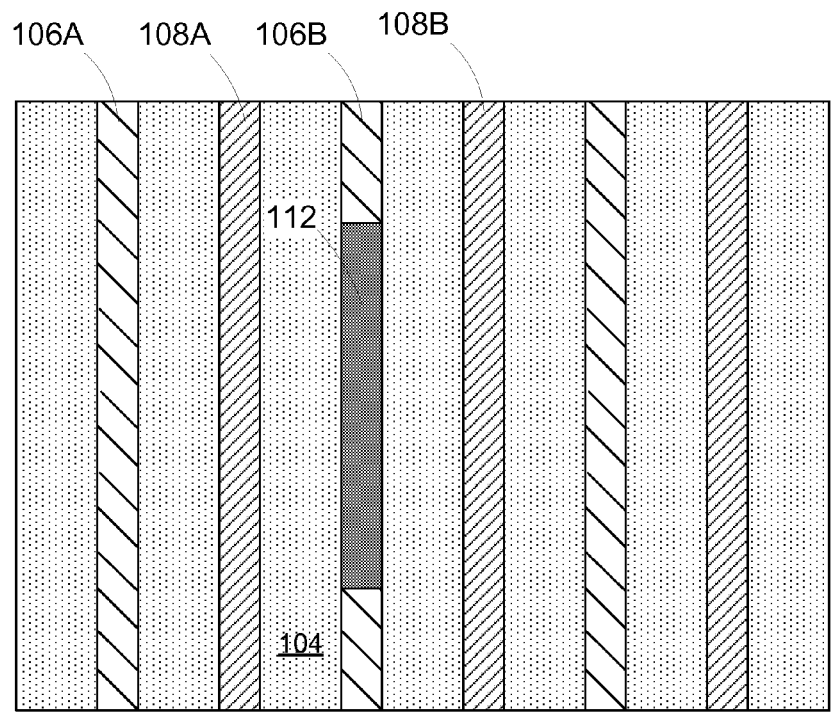

FIG. 12 depicts an example where the fins 106, 108 are formed such that they are interleaved with one another, i.e., a first fin 106 is positioned between two immediately adjacent second fins 108. In the depicted example, there are three first fins 106 (A-C) and three second fins 108 (A-C). FIG. 13 depicts an example wherein the patterned masking layer 110 is formed such that the opening 110A exposes a representative single first fin—the fin 106B—and the two immediately adjacent fins second fins—fins 108A-B. FIG. 14 depicts the product after an etching (wet or dry) process was performed through the opening 110A in the patterned masking layer 110 to remove the exposed portion of the single first fin 106B selectively relative to the second fins 108A-B, the layer of insulating material 104 and the exposed surface 109 in the bottom of the removed fin cavity 106X. As before, the exposed surface 109 in the removed fin cavity 106X may be the substrate 102, a portion of a fin structure, an SRB layer, etc. In any situation, the fin 106B (or other fins removed herein) may be removed selectively to the surface 109 exposed within the removed fin cavity 106X. FIG. 15 depicts the product after the patterned etch mask 110 was removed, the insulating material 112 was deposited so as to over-fill the removed fin cavity 106X and after a planarization process, e.g., a CMP process, was performed to planarize the insulating material 112 with the upper surface of the fins and the insulating material 104. At this point in the process flow, traditional manufacturing techniques may be performed to complete the fabrication of the FinFET devices for the product 100.

Figure 16:
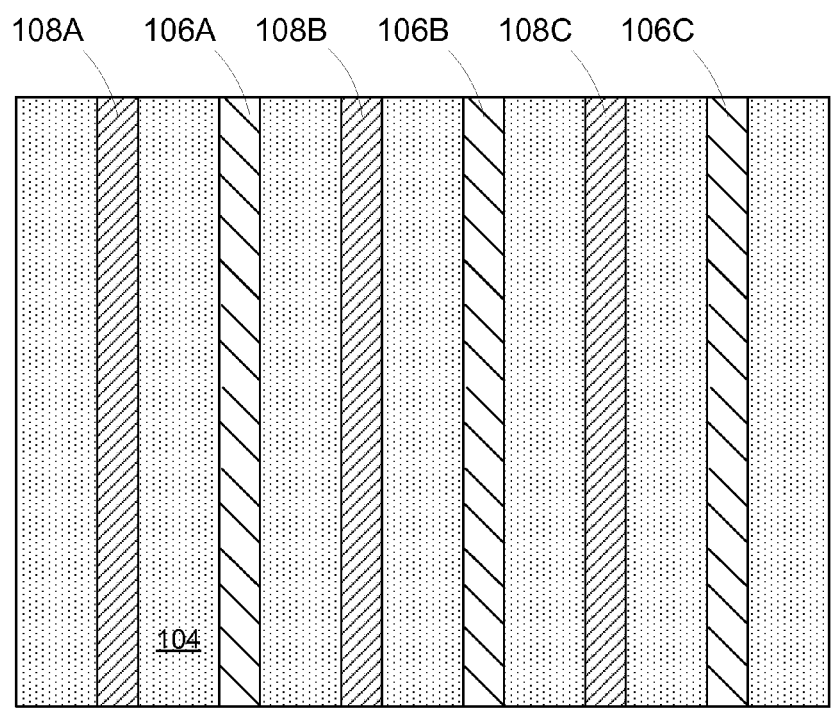
Figure 17:
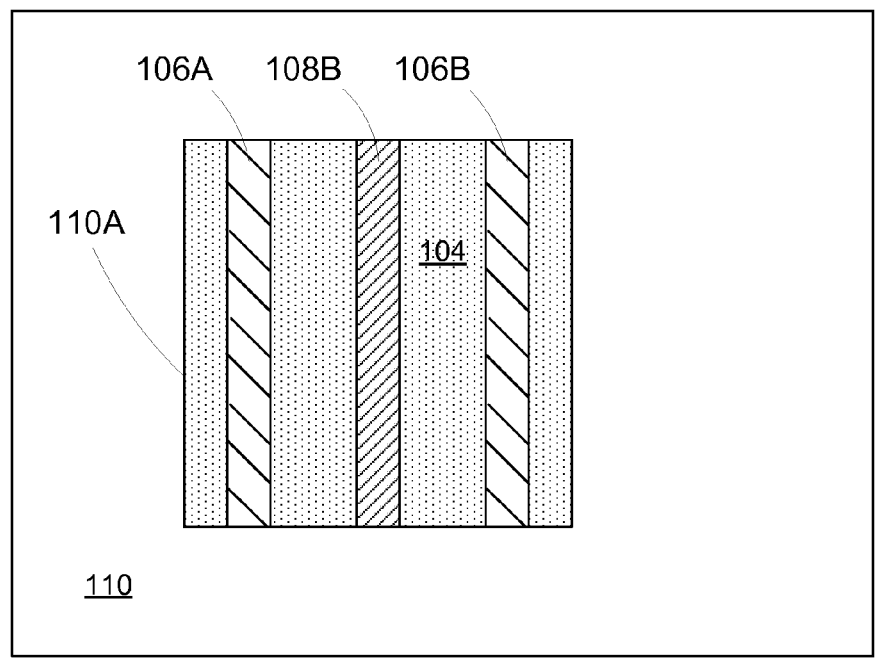
Figure 18:
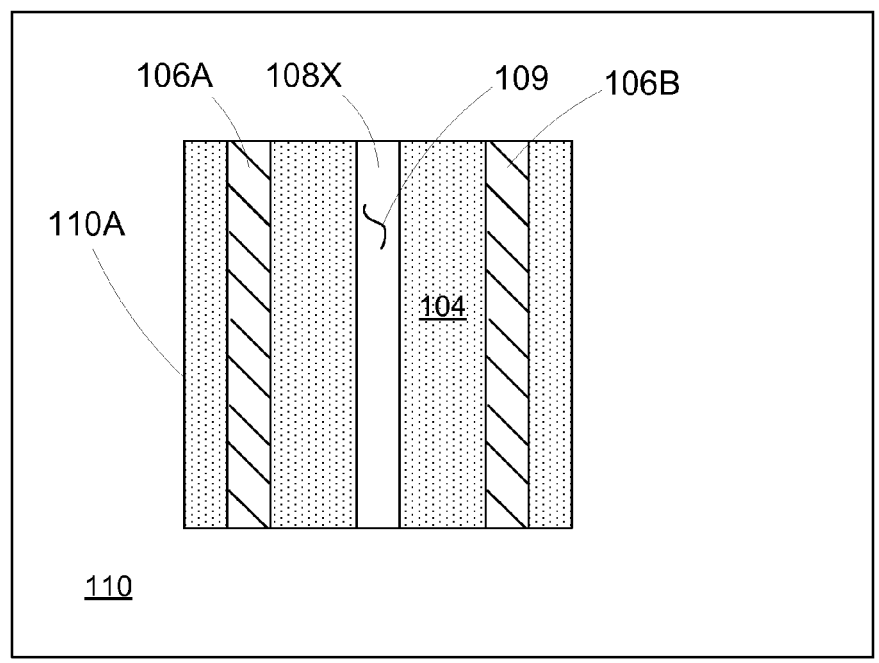
Figure 19:
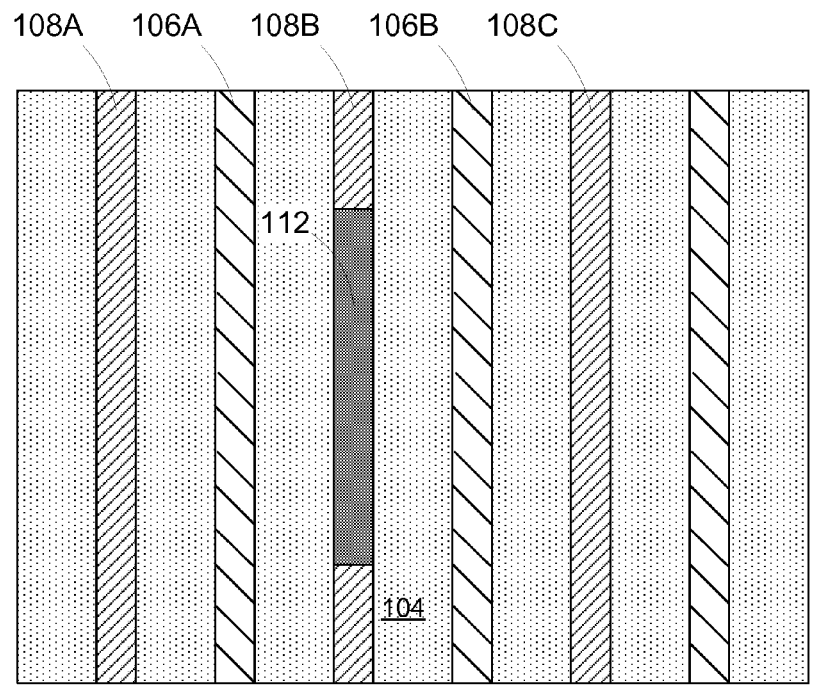

FIG. 16 depicts another example where the fins 106, 108 are formed such that they are interleaved with one another, i.e., a second fin 108 is positioned between two immediately adjacent first fins 106. In the depicted example, there are three first fins 106 (A-C) and three second fins 108 (A-C). FIG. 17 depicts an example wherein the patterned masking layer 110 is formed such that the opening 110A exposes a representative single second fin—the fin 108B—and the two immediately adjacent first fins—fins 106A-B. FIG. 18 depicts the product after an etching (wet or dry) process was performed through the opening 110A in the patterned masking layer 110 to remove the exposed portion of the representative single second fin 108B selectively relative to the first fins 106A-B, the layer of insulating material 104 and the exposed surface 109 in the bottom of the removed fin cavity 108X. FIG. 19 depicts the product after the patterned etch mask 110 was removed, the insulating material 112 was deposited so as to over-fill the removed fin cavity 108X and after a planarization process, e.g., a CMP process, was performed to planarize the insulating material 112 with the upper surface of the fins and the insulating material 104. At this point in the process flow, traditional manufacturing techniques may be performed to complete the fabrication of the FinFET devices for the product 100.

Figure 20:
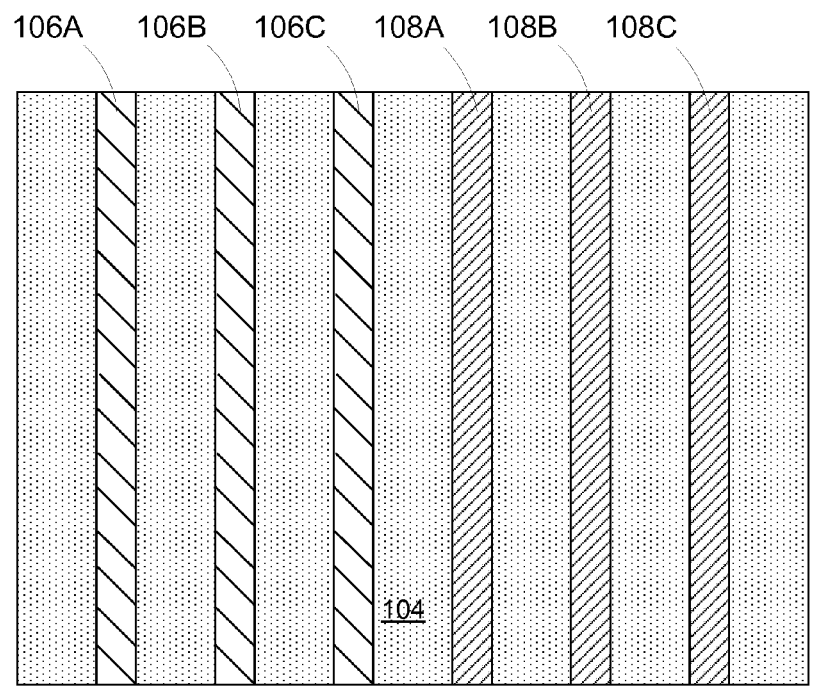
Figure 21:
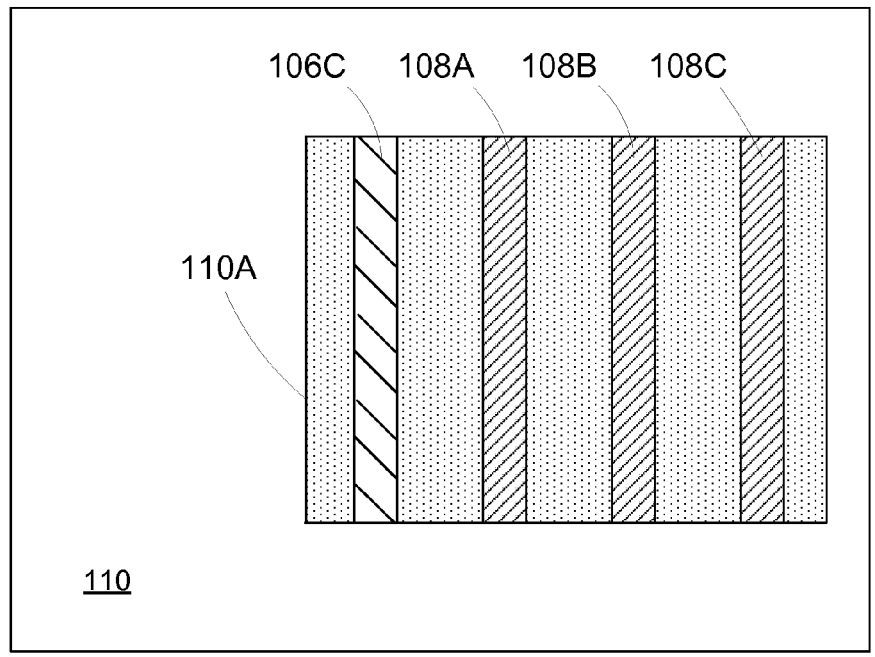
Figure 22:
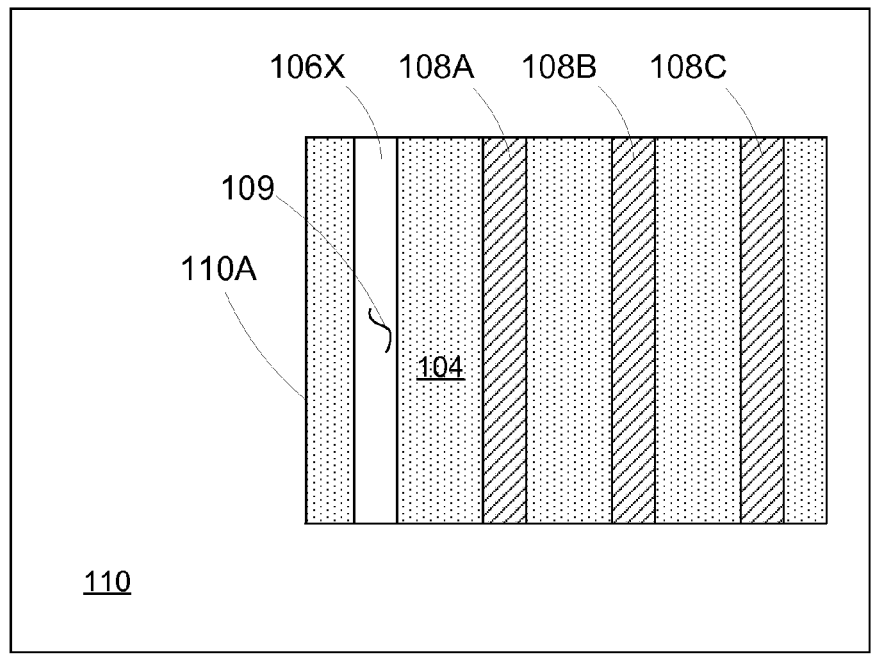
Figure 23:
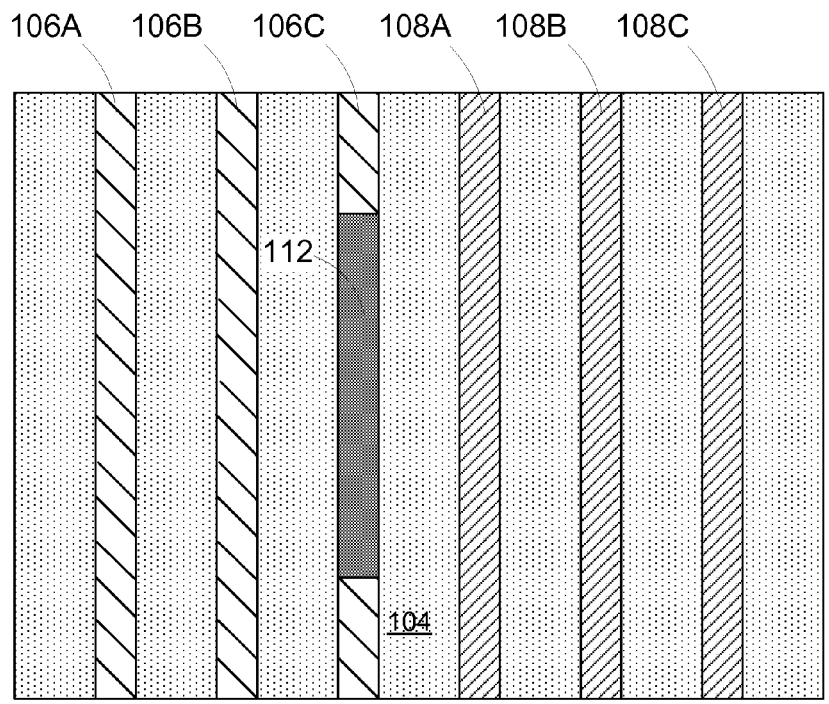

FIG. 20 depicts an example where the fins 106, 108 are formed in segregated groups. In the depicted example, there are three first fins 106(A-C) and three second fins 108 (A-C). FIG. 21 depicts an example wherein the patterned masking layer 110 is formed such that the opening 110A exposes a representative single first fin—the fin 106C that is located at the boundary between the two groups of fins—and the three of the second fins—108A-C immediately adjacent exposed first fin 106C. FIG. 22 depicts the product after an etching (wet or dry) process was performed through the opening 110A in the patterned masking layer 110 to remove the exposed portion of the single first fin 106C selectively relative to the exposed second fins 108A-C, the layer of insulating material 104 and the exposed surface 109 in the bottom of the removed fin cavity 106X. FIG. 23 depicts the product after the patterned etch mask 110 was removed, the insulating material 112 was deposited so as to over-fill the removed fin cavity 106X and after a planarization process, e.g., a CMP process, was performed to planarize the insulating material 112 with the upper surface of the fins and the insulating material 104. At this point in the process flow, traditional manufacturing techniques may be performed to complete the fabrication of the FinFET devices for the product 100.

Figure 24:
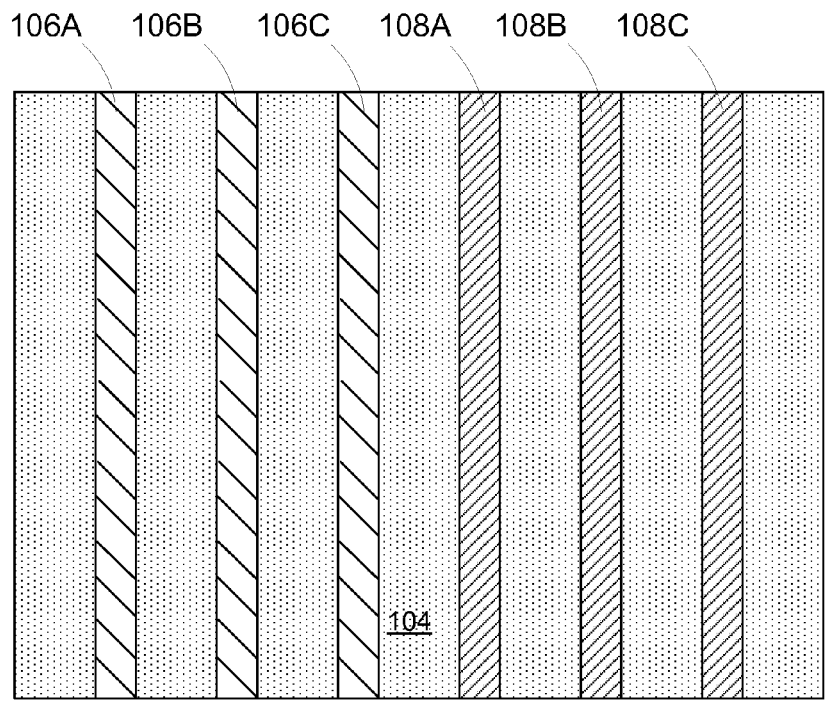
Figure 25:
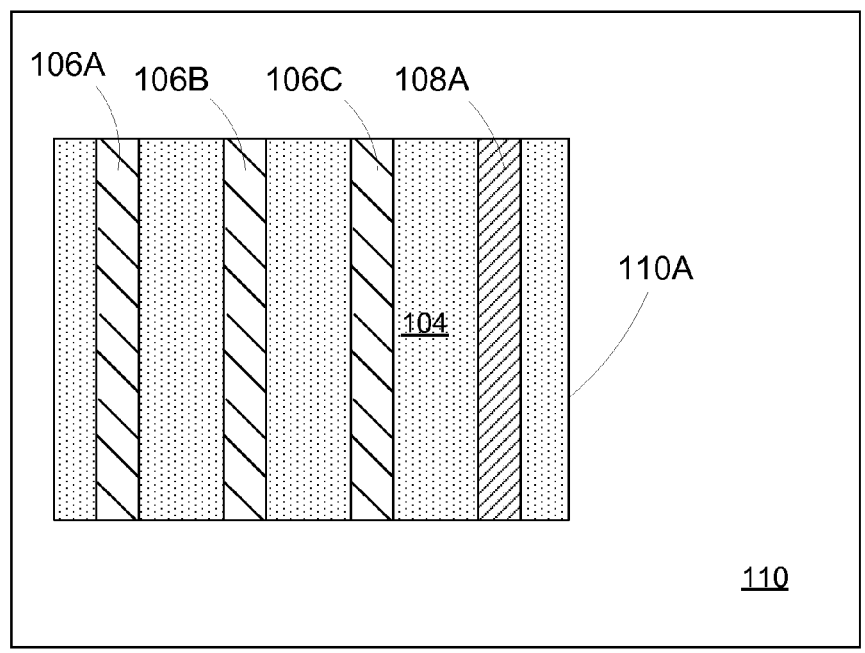
Figure 26:
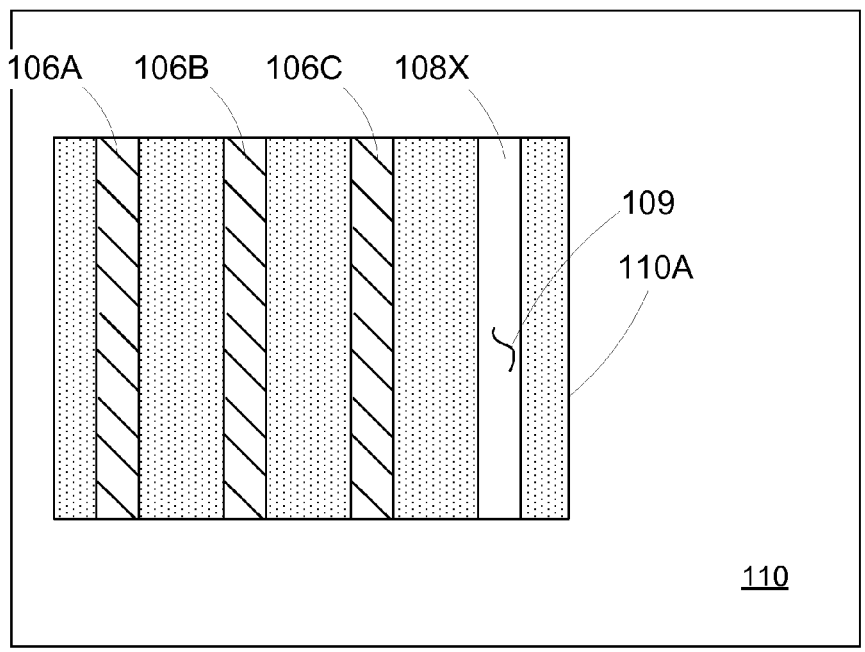
Figure 27:
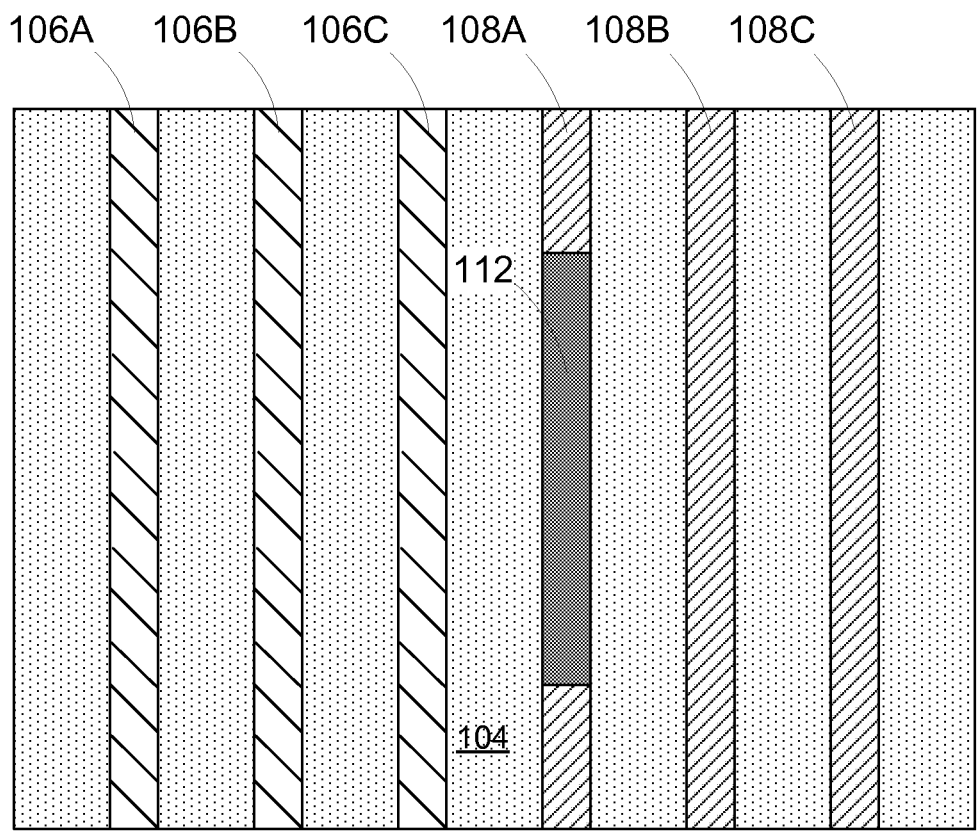

FIG. 24 depicts another example where the fins 106, 108 are formed in segregated groups. In the depicted example, there are three first fins 106 (A-C) and three second fins 108 (A-C). FIG. 25 depicts an example wherein the patterned masking layer 110 is formed such that the opening 110A exposes a representative single second fin—the fin 108A that is located at the boundary between the two groups of fins—and three of the first fins 106A-C immediately adjacent exposed second fin 108A. FIG. 26 depicts the product after an etching (wet or dry) process was performed through the opening 110A in the patterned masking layer 110 to remove the exposed portion of the representative single second fin 108A selectively relative to the exposed first fins 106A-C, the layer of insulating material 104 and the exposed surface 109 in the bottom of the removed fin cavity 108X. FIG. 27 depicts the product after the patterned etch mask 110 was removed, the insulating material 112 was deposited so as to over-fill the removed fin cavity 108X and after a planarization process, e.g., a CMP process, was performed to planarize the insulating material 112 with the upper surface of the fins and the insulating material 104. At this point in the process flow, traditional manufacturing techniques may be performed to complete the fabrication of the FinFET devices for the product 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A method, comprising:
forming a plurality of first and second fins above a semiconductor substrate, wherein said first fins are made of a first semiconductor material and said second fins are made of a second semiconductor material, wherein said first and second semiconductor materials are different from one another and may be selectively etched relative to one another;
forming a first insulating material above said substrate and between said plurality of first and second fins;
forming a patterned etch mask above said plurality of first and second fins, said patterned etch mask having an opening that exposes a portion of at least one first fin and exposes a portion of at least one second fin;
performing an etching process through said opening in said patterned etch mask to remove said exposed portion of said at least one first fin selectively to said first insulating material and said exposed portion of said at least one second fin so as to thereby define at least one removed fin cavity in said first insulating material;
removing said patterned etch mask; and
forming a second insulating material in said at least one removed fin cavity.

2. The method of claim 1, wherein said semiconductor substrate is comprised of a semiconductor material that is the same as one of said first and second semiconductor materials.

3. The method of claim 1, wherein said semiconductor substrate is comprised of a third semiconductor material that is different from both of said first and second semiconductor materials and wherein said third semiconductor material may be selectively etched relative to said first and second semiconductor materials.

4. The method of claim 1, wherein said first and second insulating materials are comprised of the same insulating material.

5. The method of claim 1, wherein said first and second insulating materials are comprised of different insulating materials.

6. The method of claim 1, wherein said patterned etch mask is comprised of one of a patterned layer of photoresist or a patterned hard mask layer.

7. The method of claim 1, wherein said forming said second insulating material in said at least one removed fin cavity comprises:
over-filling said at least one removed fin cavity with said second insulating material; and
performing a CMP process to planarize an upper surface of said second insulating material with an upper surface of said first insulating material and an upper surface of each of said plurality of first and second fins.

8. The method of claim 1, wherein said performing said etching process comprises performing one of a wet or dry etching process.

9. The method of claim 1, wherein said forming said patterned etch mask comprises forming said patterned etch mask such that said opening in said patterned etch mask exposes a portion of only a single first fin and said at least one second fin.

10. The method of claim 1, wherein said forming said patterned etch mask comprises forming said patterned etch mask such that said opening in said patterned etch mask exposes a portion of only a single first fin and exposes a portion of at least two second fins.

11. The method of claim 1, wherein said forming said patterned etch mask comprises forming said patterned etch mask such that said opening in said patterned etch mask exposes a portion of at least two first fins and exposes a portion of at least two second fins.

12. The method of claim 1, wherein said forming said patterned etch mask comprises forming said patterned etch mask such that said opening in said patterned etch mask exposes a portion of only a single first fin and exposes a portion of at least three second fins.

13. The method of claim 1, wherein said first and second fins are formed in an interleaved relationship.

14. The method of claim 1, wherein said first and second fins are formed in separate groups.

15. The method of claim 1, wherein said first fins are made of silicon and said second fins are made of one or silicon-germanium, silicon-carbon or a III-V material.

16. The method of claim 1, wherein said second fins are made of silicon and said first fins are made of one or silicon-germanium, silicon-carbon or a III-V material.

17. The method of claim 1, wherein said first fins are made of silicon-germanium, said second fins are made of silicon-carbon and said substrate is made of silicon.

18. A method, comprising:
forming a plurality of first and second fins above a semiconductor substrate, wherein said first fins are made of a first semiconductor material and said second fins are made of a second semiconductor material, wherein said first and second semiconductor materials are different from one another and may be selectively etched relative to one another and wherein said substrate is made of one of said first and second semiconductor materials;
forming a first insulating material above said substrate and between said plurality of first and second fins;
forming a patterned etch mask above said plurality of first and second fins, said patterned etch mask having an opening that exposes a portion of only a single first fin and exposes a portion of at least one second fin;
performing an etching process through said opening in said patterned etch mask to remove said exposed portion of said single first fin selectively to said first insulating material and said exposed portion of said at least one second fin so as to thereby define a removed fin cavity in said first insulating material;
removing said patterned etch mask; and
forming a second insulating material in said removed fin cavity, wherein said first and second insulating materials are comprised of the same insulating material.

19. The method of claim 18, wherein said forming said second insulating material in said removed fin cavity comprises:
over-filling said removed fin cavity with said second insulating material; and
performing a CMP process to planarize an upper surface of said second insulating material with an upper surface of said first insulating material and an upper surface of each of said plurality of first and second fins.

20. The method of claim 18, wherein said performing said etching process comprises performing one of a wet or dry etching process.

21. The method of claim 18, wherein said forming said patterned etch mask comprises forming said patterned etch mask such that said opening in said patterned etch mask exposes said portion of said single first fin and exposes a portion of at least two second fins.

22. The method of claim 18, wherein said forming said patterned etch mask comprises forming said patterned etch mask such that said opening in said patterned etch mask exposes said portion of said single first fin and exposes a portion of at least three second fins.

23. The method of claim 18, wherein said first and second fins are formed in an interleaved relationship.

24. The method of claim 18, wherein said first and second fins are formed in separate groups.

25. The method of claim 18, wherein said first fins and said substrate are made of silicon and said second fins are made of one or silicon-germanium, silicon-carbon or a III-V material.

26. The method of claim 18, wherein said second fins and said substrate are made of silicon and said first fins are made of one or silicon-germanium, silicon-carbon or a III-V material.

27. A method, comprising:
forming a plurality of first and second fins above a semiconductor substrate, wherein said first fins are made of a first semiconductor material and said second fins are made of a second semiconductor material, wherein said first and second semiconductor materials are different from one another and may be selectively etched relative to one another and wherein said semiconductor substrate is comprised of a semiconductor material that is the same as one of said first and second semiconductor materials;
forming a first insulating material above said substrate and between said plurality of first and second fins;
forming a patterned etch mask above said plurality of first and second fins, said patterned etch mask having an opening that exposes a portion of only a single first fin and exposes a portion of at least one second fin;
performing an etching process through said opening in said patterned etch mask to remove said exposed portion of said single first fin selectively to said first insulating material and said exposed portion of said at least one second fin so as to thereby define a removed fin cavity in said first insulating material;
removing said patterned etch mask; and
forming a second insulating material in said removed fin cavity.

* * * * *